United States Patent
Otsuka

(10) Patent No.: US 12,154,807 B2
(45) Date of Patent: Nov. 26, 2024

(54) ARTICLE TRANSPORT FACILITY

(71) Applicant: Daifuku Co., Ltd., Osaka (JP)

(72) Inventor: Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 140 days.

(21) Appl. No.: 18/101,351

(22) Filed: Jan. 25, 2023

(65) Prior Publication Data
US 2023/0234787 A1  Jul. 27, 2023

(30) Foreign Application Priority Data

Jan. 26, 2022 (JP) ................................ 2022-010159

(51) Int. Cl.
| | |
|---|---|
| *H01L 21/677* | (2006.01) |
| *B61B 3/02* | (2006.01) |
| *B65G 1/04* | (2006.01) |
| *B65G 47/61* | (2006.01) |
| *B65G 47/64* | (2006.01) |
| *E01B 25/26* | (2006.01) |

(52) U.S. Cl.
CPC .......... *H01L 21/67715* (2013.01); *B61B 3/02* (2013.01); *B65G 1/0457* (2013.01); *B65G 47/61* (2013.01); *B65G 47/64* (2013.01); *E01B 25/26* (2013.01); *H01L 21/67733* (2013.01)

(58) Field of Classification Search
CPC ...... B65G 1/0457; B65G 9/008; B65G 47/61; B65G 2207/18; B61B 3/02; E01B 25/26
See application file for complete search history.

(56) References Cited

U.S. PATENT DOCUMENTS

| | | | | |
|---|---|---|---|---|
| 6,629,502 | B2 * | 10/2003 | Matsukawa | E01B 25/06 104/96 |
| 7,669,533 | B2 * | 3/2010 | Kyutoku | E01B 25/26 104/130.09 |
| 8,978,562 | B2 * | 3/2015 | Nagamine | E01B 25/26 104/91 |
| 9,896,275 | B2 * | 2/2018 | Ikenaga | B65G 43/00 |
| 10,023,205 | B2 * | 7/2018 | Kinugawa | B61B 3/02 |
| 2008/0127851 | A1 | 6/2008 | Kyutoku | |

FOREIGN PATENT DOCUMENTS

JP          2008126743 A      6/2008

* cited by examiner

*Primary Examiner* — Gene O Crawford
*Assistant Examiner* — Keith R Campbell
(74) *Attorney, Agent, or Firm* — The Webb Law Firm

(57) ABSTRACT

A control system performs pre-urging to control a guide wheel driver to urge a guide wheel from a first position toward a second position when the guide wheel in a first width direction in a first guide section is in contact with a first side surface of a guide rail before entering an unguided section. The control system continuously performing the pre-urging allows the guide wheel to pass through the unguided section to move the guide wheel from the first position to the second position in the unguided section, and places the guide wheel in a second width direction in a second guide section into contact with a second side surface of the guide rail.

9 Claims, 12 Drawing Sheets

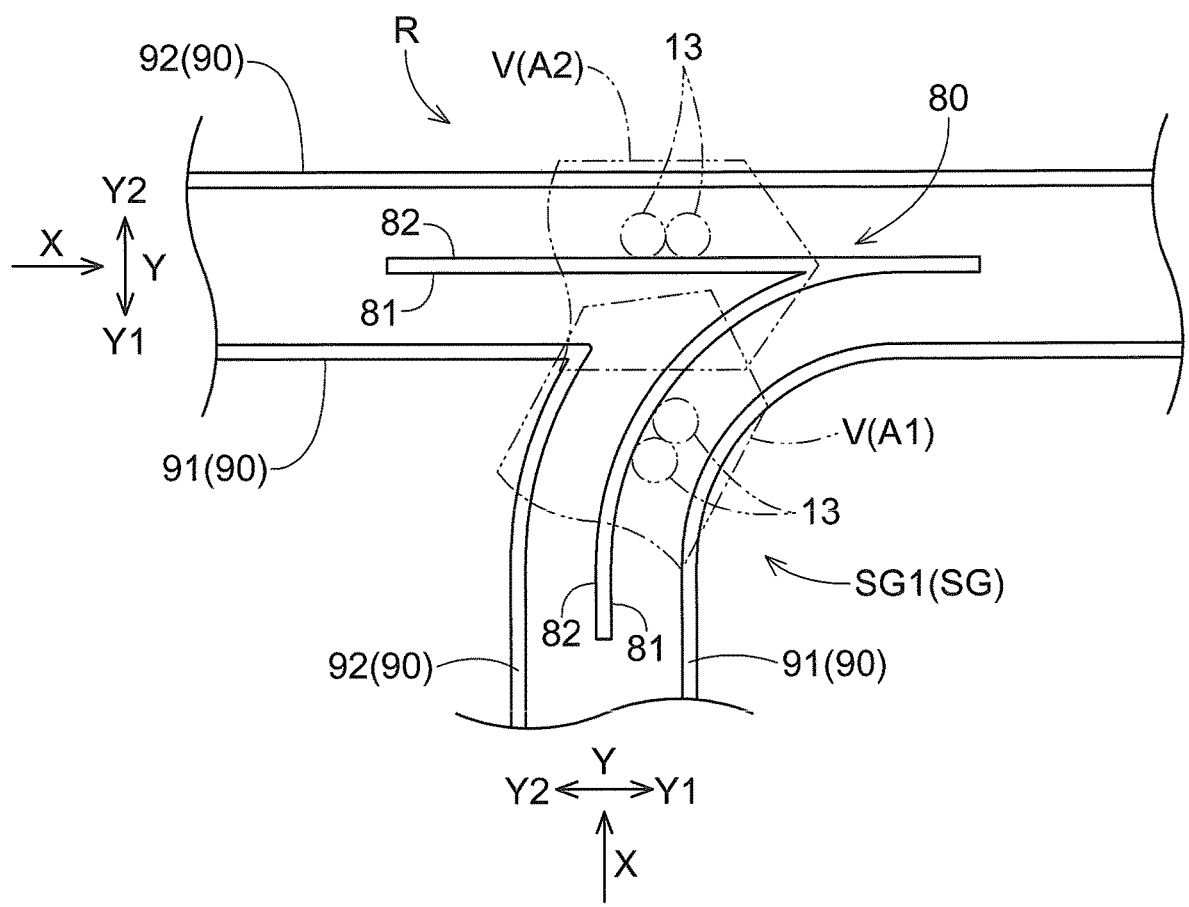

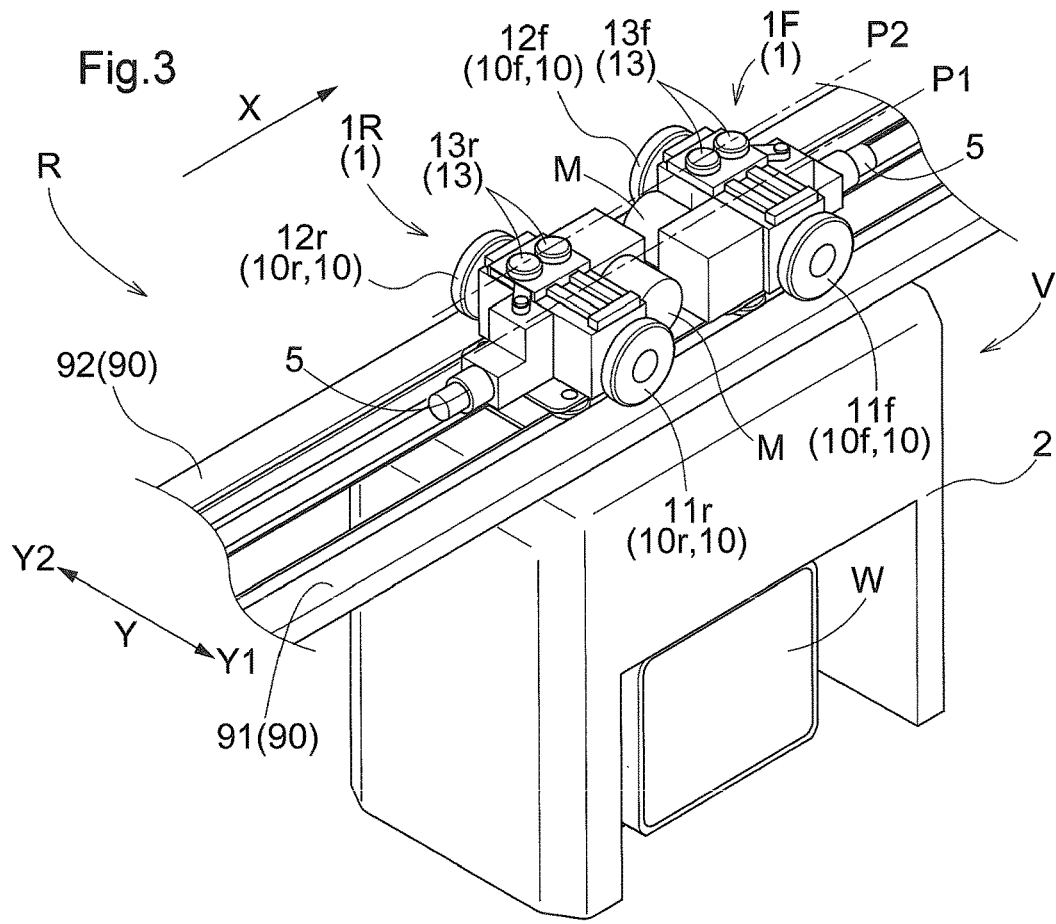
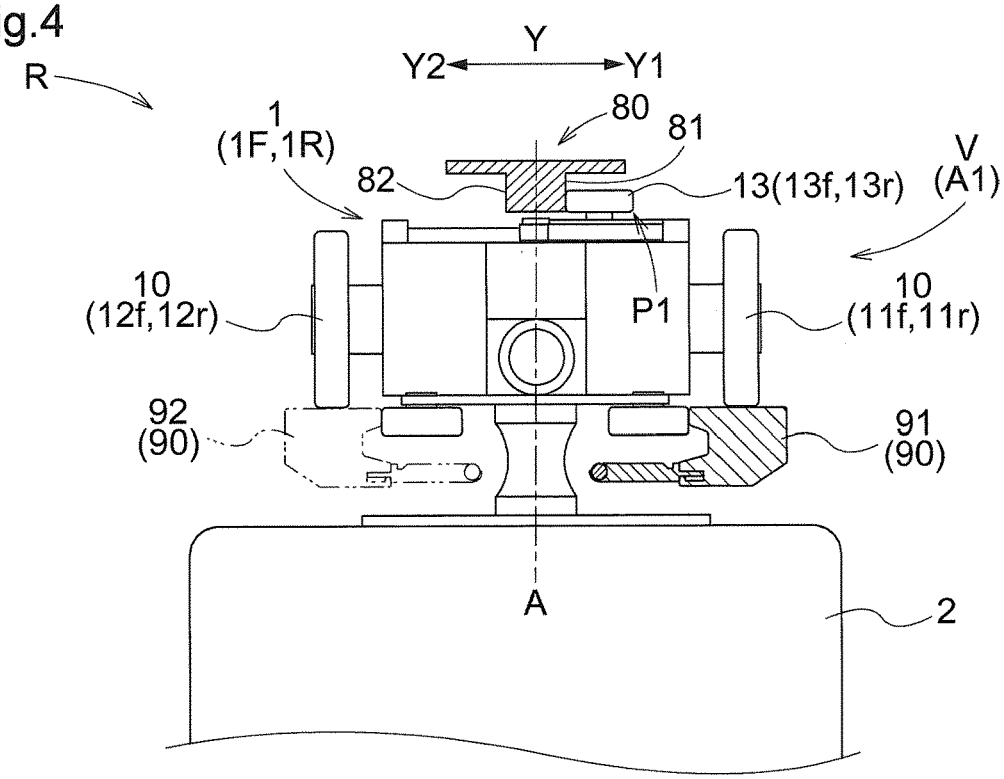

ARTICLE TRANSPORT FACILITY

CROSS-REFERENCE TO RELATED APPLICATION

This application claims priority to Japanese Patent Application No. 2022-010159 filed Jan. 26, 2022, the disclosure of which is hereby incorporated by reference in its entirety.

BACKGROUND OF THE INVENTION

Field of the Invention

The present invention relates to an article transport facility including a pair of travel rails along a travel path, a transport vehicle that travels along the travel path to transport articles, and a guide rail that guides the transport vehicle.

Description of the Related Art

Such an article transport facility guides a transport vehicle including guide wheels by guiding the guide wheels along a guide rail in a section on a travel path including an intersection or a curve. Japanese Unexamined Patent Application Publication No. 2008-126743 (Patent Literature 1) describes an example article transport facility that guides the transport vehicle using a guide rail. Reference signs in parentheses used below in describing the background are the reference signs in Patent Literature 1.

The article transport facility described in Patent Literature 1 includes, as guide rails, a direction control guide (15) located downstream in a moving direction, and another direction control guide (17) located upstream from the direction control guide (15) in the moving direction. The facility shifts a traveling unit (40) in a first width direction (rightward in FIG. 2) in a separate area between the direction control guide (15) and the direction control guide (17) in the moving direction to positionally shift guide wheels (41) included in the traveling unit (40) in the width direction. Thus, the guide wheels (41) guided by the direction control guide (15) are shifted to be guided by the direction control guide (17). When the guide wheels (41) are guided by the direction control guide (17), the moving direction of a transport vehicle (30) is changed to the direction in which the direction control guide (17) extends. The article transport facility that guides the transport vehicle using guide rails thus shifts the guide wheels rightward to guide the transport vehicle rightward, and shifts the guide wheels leftward to guide the transport vehicle leftward.

SUMMARY OF THE INVENTION

A particular travel path layout or a particular transport path set for a transport vehicle may involve prompt positional shifting of the guide wheels in the width direction. In response to a possible delay in such shifting of the guide wheels, the transport vehicle is usually decelerated to create time for such shifting. However, decelerating the transport vehicle can lower the transportation efficiency of the overall facility.

In response to the above issue, a technique is awaited for positionally shifting guide wheels in the width direction appropriately without decelerating a transport vehicle.

A technique responding to the above issue has the structure described below. An article transport facility includes a pair of travel rails along a travel path, a transport vehicle that travels along the travel path to transport an article, a guide rail located in at least one of a section on the travel path including an intersection or a section on the travel path including a curve to guide the transport vehicle, and a control system that controls the transport vehicle. The transport vehicle includes travel wheels that roll on upper surfaces of the pair of travel rails, a guide wheel that rolls on a first side surface of the guide rail facing in a first width direction or on a second side surface of the guide rail facing in a second width direction, and a guide wheel driver that moves the guide wheel in the width direction to a first position for the guide wheel to roll on the first side surface and to a second position for the guide wheel to roll on the second side surface. The first width direction and the second width direction opposite to the first width direction are included in a width direction perpendicular to a travel direction along the travel path when viewed from above or below. The travel path includes a plurality of guide sections each including the guide rail and an unguided section including no guide rail. The plurality of guide sections include a first guide section and a second guide section, and the second guide section is located downstream from the first guide section in the travel direction across the unguided section. The control system performs pre-urging for the transport vehicle sequentially traveling through the first guide section, the unguided section, and the second guide section when the guide wheel is at the first position in the first guide section and at the second position in the second guide section. The pre-urging is performed to control the guide wheel driver to urge the guide wheel from the first position toward the second position when the guide wheel in the first width direction in the first guide section is in contact with the first side surface of the guide rail before entering the unguided section. The control system continuously performing the pre-urging allows the guide wheel to pass through the unguided section to move the guide wheel from the first position to the second position in the unguided section, and places the guide wheel in the second width direction in the second guide section into contact with the second side surface of the guide rail.

The article transport facility with this structure performs preliminary urging (pre-urging), or specifically, urges the guide wheel toward the second position after the guide wheel enters the first guide section and before the wheel enters the unguided section. When entering the unguided section, the guide wheel can be promptly shifted in the width direction from the first position to the second position. Thus, the guide wheel can be promptly shifted in the unguided section. This structure reduces the chances to decelerate the transport vehicle for shifting the guide wheel. This structure can thus positionally shift the guide wheel in the width direction appropriately with less deceleration of the transport vehicle. With less deceleration of the transport vehicle, the transportation efficiency of the overall facility is less likely to decrease.

Further aspects and features of the technique according to the present disclosure will be apparent from exemplary and nonlimiting embodiments described below with reference to the drawings.

BRIEF DESCRIPTION OF DRAWINGS

FIG. 2 is a plan view of a guide section.
FIG. 3 is a perspective view of a transport vehicle.
FIG. 4 is a view of the transport vehicle in a first two-wheel travel state as viewed in a travel direction.

DESCRIPTION OF THE INVENTION

An article transport facility according to an embodiment will be described with reference to the drawings.

Figure 1:
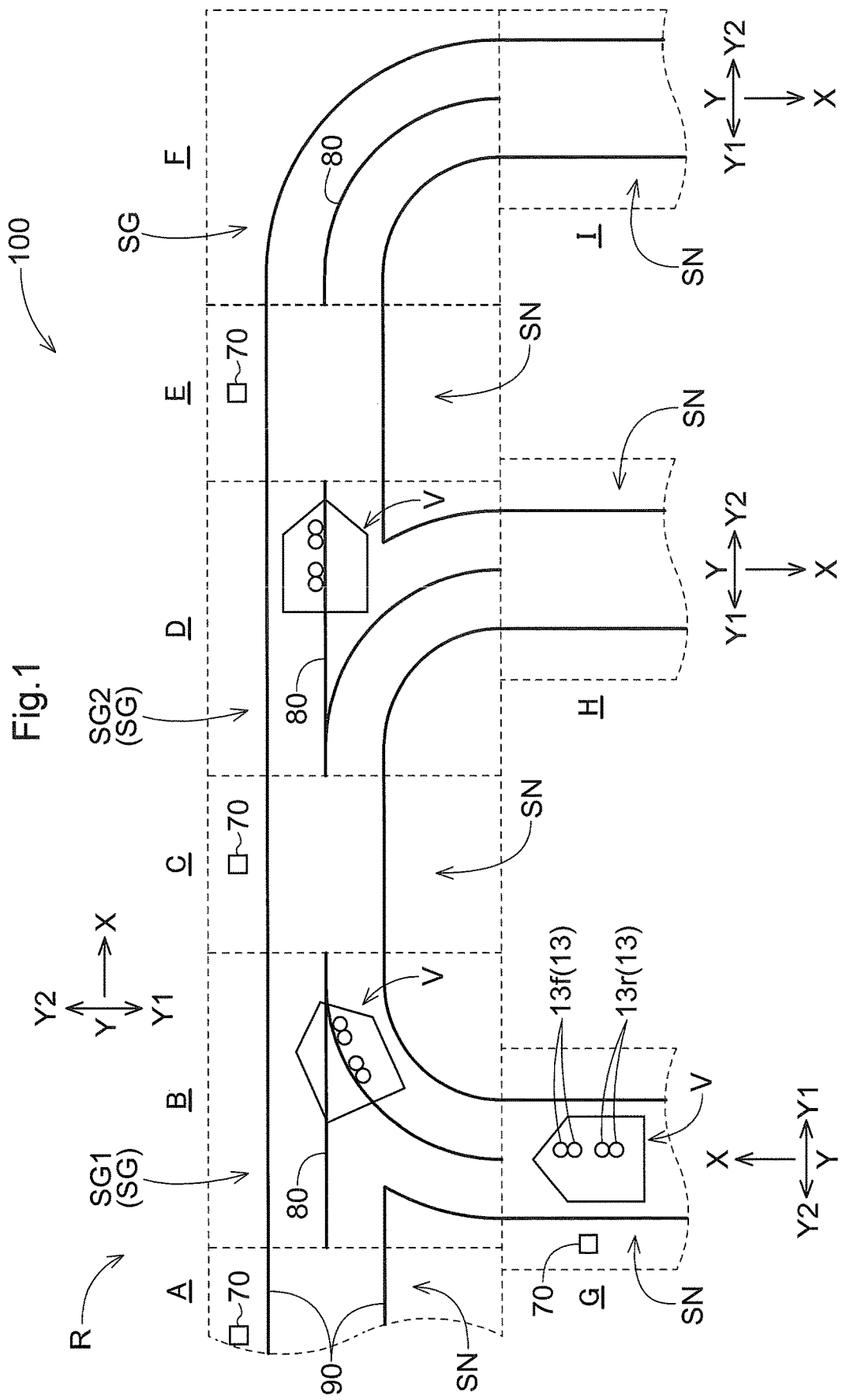
FIG. 1 is a partial plan view of an article transport facility.

As shown in FIGS. 1 to 3, an article transport facility 100 includes a pair of travel rails 90 extending along a travel path R, transport vehicles V each traveling along the travel path R to transport an article W, a guide rail 80 located in at least one of a section on the travel path R including an intersection or a section on the travel path R including a curve to guide the transport vehicles V, and a control system H (refer to FIG. 6) that controls the transport vehicles V.

The direction along the travel path R is hereafter referred to as a travel direction X, and the direction perpendicular to the travel direction X when viewed from above or below is hereafter referred to as a width direction Y. The width direction Y includes a first width direction Y1 and a second width direction Y2 opposite to the first width direction Y1. For example, the first width direction Y1 is the right from the direction in which the transport vehicles V move, and the second width direction Y2 is opposite to the first width direction Y1 and is the left. However, the first width direction Y1 and the second width direction Y2 may not be fixed to the right and the left. For example, the first width direction Y1 may be the left, and the second width direction Y2 may be the right.

As shown in FIG. 1, the travel path R includes multiple guide sections SG each including a guide rail 80, and one or more unguided sections SN each including no guide rail 80. The travel path R in the figure includes multiple unguided sections SN.

The guide sections SG and the unguided sections SN alternate along the travel path R. Each transport vehicle V travels through the guide sections SG and the unguided sections SN alternately. FIG. 1 shows multiple sections A to I into which the travel path R is divided in the travel direction X. The sections B and D each include an intersection. The section F includes a curve. These sections B, D, and F are guide sections SG each including the guide rail 80. The other sections A, C, E, G, H, and I are unguided sections SN each including no guide rail 80. FIG. 1 shows the transport vehicles sequentially traveling through the sections G, B, C, D, and E.

The guide sections SG includes a first guide section SG1, and a second guide section SG2, which is a guide section SG located downstream from the first guide section SG1 in the travel direction X across an unguided section SN. In this case, the second guide section SG2 is the guide section SG adjacent to and downstream from the first guide section SG1 in the travel direction X across an unguided section SN. In the illustrated example, the section B corresponds to the first guide section SG1. The section D downstream from the section B in the travel direction X across the section C corresponds to the second guide section SG2. The first guide section SG1 and the second guide section SG2 are defined for ease of illustration, and any of the sections B, D, and F as the guide sections SG may be the first guide section SG1 or the second guide section SG2.

The structure according to the present embodiment includes detectable members 70 at predetermined positions along the travel path R. The detectable members 70 are to be detected by a detector 4 (refer to FIG. 6) included in each transport vehicle V. Each detectable member 70 holds address information (information indicating the position along the travel path R) indicating its position. Each transport vehicle V reads address information held by each detectable member 70 to detect its current position. For example, a one-dimensional or two-dimensional code may be used as each detectable member 70, and a one-dimensional or two-dimensional code reader may be used as the detector 4.

In the present embodiment, each detectable member 70 is located in at least a section adjacent to and upstream from each guide section SG in the travel direction X. More specifically, the detectable members 70 are located in the unguided sections SN adjacent to and upstream from the guide sections SG in the travel direction X. The detectable members 70 are not located in the guide sections SG in the illustrated example, but may be located in the guide sections SG.

In the present embodiment, in the section on the travel path R including an intersection or a curve, one travel rail 90 in the pair is discontinued. In this example, in the sections B and D as the guide sections SG each including an intersection, one travel rail 90 in the pair is discontinued.

As shown in FIGS. 2 and 3, the pair of travel rails 90 are spaced from each other in the width direction Y and extend along the travel path R. One travel rail 90 in the pair located in the first width direction Y1 is hereafter referred to as a first travel rail 91, and the other travel rail 90 located in the second width direction Y2 is hereafter referred to as a second travel rail 92. The first travel rail 91 and the second travel rail 92 may be hereafter simply and collectively referred to as travel rails 90.

In the present embodiment, the pair of travel rails 90 are spaced upward from the floor surface. The pair of travel rails 90 are, for example, hung from the ceiling.

The guide rails 80 are located above the pair of travel rails 90 (refer to FIG. 4 and other drawings). More specifically, as in the pair of travel rails 90, the guide rails 80 are spaced upward from the floor surface. The guide rails 80 are, for example, hung from the ceiling.

As shown in FIG. 3, in the present embodiment, each transport vehicle V is a ceiling-hung transport vehicle for transporting the article W along the travel path R installed on or near the ceiling. The article W is a target to be transported by the transport vehicle V. For example, the article W is a front opening unified pod (FOUP) for accommodating semiconductor wafers or a reticle pod for accommodating reticles.

Each transport vehicle V includes travel wheels 10 that roll on the upper surfaces of the pair of travel rails 90, and travel wheel drivers M that drive the travel wheels 10. The travel wheels 10 are spaced from each other in at least the travel direction X or the width direction Y. In this example, the multiple travel wheels 10 are spaced from each other in the travel direction X and the width direction Y. Each travel wheel driver M is, for example, an electric motor such as a servomotor.

In the present embodiment, the travel wheels 10 include front wheels 10$f$ and rear wheels 10$r$. More specifically, the travel wheels 10 include a first front wheel 11$f$ that rolls on the upper surface of the first travel rail 91, a first rear wheel 11$r$ that rolls on the first travel rail 91 and is located at the rear of the first front wheel 11$f$ in the moving direction, a second front wheel 12$f$ that rolls on the upper surface of the second travel rail 92, and a second rear wheel 12$r$ that rolls on the second travel rail 92 and is located at the rear of the second front wheel 12$f$ in the moving direction. In other words, in this example, the front wheels 10$f$ include the first front wheel 11$f$ and the second front wheel 12$f$, and the rear wheels 10$r$ include the first rear wheel 11$r$ and the second rear wheel 12$r$.

In the present embodiment, each transport vehicle V includes travelers 1 and a body 2. The travelers 1 allow the transport vehicle V to travel, and are located above the travel rails 90. The body 2 is connected to the travelers 1 and located below the travel rails 90. In this example, the body 2 supports the article W. The article W supported by the body 2 is transported by the transport vehicle V.

The travelers 1 in the present embodiment include a front traveler 1F and a rear traveler 1R at the rear of the front traveler 1F in the moving direction. In this example, the front traveler 1F supports the first front wheel 11$f$ and the second front wheel 12$f$. The rear traveler 1R supports the first rear wheel 11$r$ and the second rear wheel 12$r$. More specifically, in the present embodiment, each transport vehicle V includes the front traveler 1F including the front wheels 10$f$ (the first front wheel 11$f$ and the second front wheel 12$f$) as the travel wheels 10, and the rear traveler 1R including the rear wheels 10$r$ (the first rear wheel 11$r$ and the second rear wheel 12$r$) as the travel wheels 10.

Figure 5:
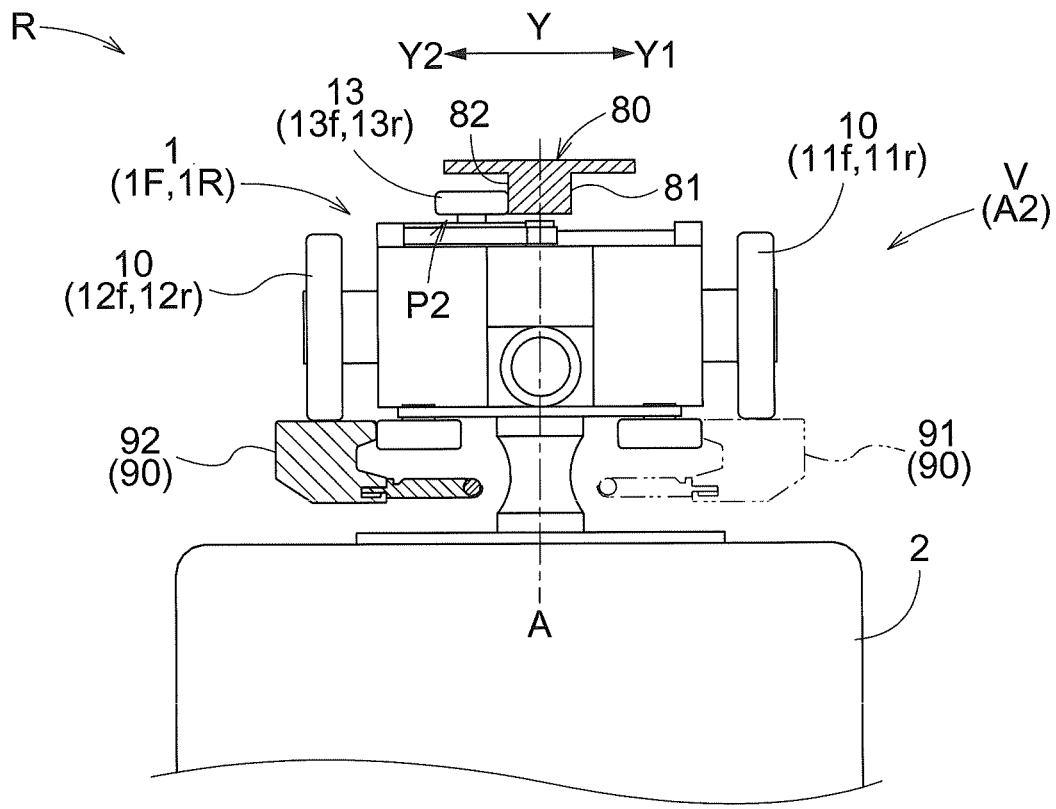
FIG. 5 is a view of the transport vehicle in a second two-wheel travel state as viewed in a travel direction.

As shown in FIGS. 3 to 5, each transport vehicle V includes guide wheels 13 that roll on a first side surface 81 of the guide rail 80 facing in the first width direction Y1 or a second side surface 82 of the guide rail 80 facing in the second width direction Y2, and guide wheel drivers 5 that move the guide wheels 13 in the width direction Y to a first position P1 for the guide wheels 13 to roll on the first side surface 81, and a second position P2 for the guide wheels 13 to roll on the second side surface 82.

The guide wheels 13 are supported by the travelers 1 in a rotatable manner about the vertical axis. Thus, each guide wheel 13 can roll on the first side surface 81 and the second side surface 82 of the guide rail 80. The travel wheels 10 are supported by the travelers 1 in a rotatable manner about the axis extending in the width direction Y.

The guide wheel drivers 5 urge and move the guide wheels 13 in the width direction Y. The guide wheel drivers 5 move the guide wheels 13 in the width direction Y to the first position P1 in the first width direction Y1, or to the second position P2 in the second width direction Y2 from a center A (refer to FIGS. 4 and 5) of the travelers 1 in the width direction Y. The guide wheel drivers 5 are, for example, rotary solenoids, and move each guide wheel 13 to the first position P1 or to the second position P2 in accordance with whether the power is on or off.

To pass through the area including the guide rail 80 while remaining at the first position P1 as shown in FIG. 4, each guide wheel 13 rolls on the first side surface 81 of the guide rail 80 to be appropriately guided by the guide rail 80.

To pass through the area including the guide rail 80 while remaining at the second position P2 as shown in FIG. 5, each guide wheel 13 rolls on the second side surface 82 of the guide rail 80 to be appropriately guided by the guide rail 80.

As shown in FIG. 3, each transport vehicle V in the present embodiment includes front guide wheels 13$f$ as the guide wheels 13 in the front traveler 1F, and rear guide wheels 13$r$ as the guide wheels 13 in the rear traveler 1R. In the illustrated example, a pair of front guide wheels 13$f$ are supported by the front traveler 1F at the same position in the width direction Y and aligned in the travel direction X. A pair of rear guide wheels 13$r$ are supported by the rear traveler 1R at the same position in the width direction Y and aligned in the travel direction X. In this example, the guide wheel drivers 5 are provided for the front guide wheels 13$f$ and the rear guide wheels 13$r$. The front guide wheels 13$f$ (the pair of front guide wheels 13$f$ in this example) and the rear guide wheels 13$r$ (the pair of rear guide wheels 13$r$ in this example) are driven independently. The front guide wheels 13$f$ and the rear guide wheels 13$r$ may be hereafter simply and collectively referred to as the guide wheels 13.

As described above, one travel rail 90 in the pair in the present embodiment is discontinued in the section on the travel path R including an intersection or a curve. In the section in which one travel rail 90 in the pair is discontinued, the transport vehicle V travels on two wheels, or has one travel wheel 10 in each pair of travel wheels 10, spaced from each other in the width direction Y, rolling on the travel rail 90, and the other travel wheel 10 in the pair being suspended. In this example, in the section in which one travel rail 90 in the pair is discontinued, the transport vehicle V is in a first two-wheel travel state A1 or a second two-wheel travel state A2 (refer to FIG. 2).

As shown in FIGS. 2 and 4, in the section in which the second travel rail 92 in the pair of travel rails 90 is discontinued, the transport vehicle V is in the first two-wheel travel state A1 in which the travel wheels 10 (the first front wheel 11$f$ and the first rear wheel 11$r$) located in the first width direction Y1 roll on the upper surface of the first travel rail 91, and the travel wheels 10 (the second front wheel 12$f$ and the second rear wheel 12$r$) located in the second width direction Y2 are suspended. When the transport vehicle V is in the first two-wheel travel state A1, the first front wheel 11$f$ and the first rear wheel 11$r$ roll on the upper surface of the first travel rail 91, and each guide wheel 13 located at the first position P1 rolls on the first side surface 81 of the guide rail 80. In the first two-wheel travel state A1, the transport vehicle V travels along the travel path R, remaining in a horizontal state (horizontal posture) with at least the first front wheel 11$f$, the first rear wheel 11$r$, and the guide wheels 13 on the rails.

As shown in FIGS. 2 and 5, in the section in which the first travel rail 91 in the pair of travel rails 90 is discontinued, the transport vehicle V is in the second two-wheel travel state A2 in which the travel wheels 10 (the second front wheel 12$f$ and the second rear wheel 12$r$) located in the second width direction Y2 roll on the upper surface of the second travel rail 92, and the travel wheels 10 (the first front wheel 11$f$ and the first rear wheel 11$r$) located in the first width direction Y1 are suspended. When the transport vehicle V is in the second two-wheel travel state A2, the second front wheel 12$f$ and the second rear wheel 12$r$ roll on the upper surface of the second travel rail 92, and each guide wheel 13 located at the second position P2 rolls on the second side surface 82 of the guide rail 80. In the second two-wheel travel state A2, the transport vehicle V travels along the travel path R, remaining in a horizontal state (horizontal position) with at least the second front wheel 12f, the second rear wheel 12r, and the guide wheels 13 on the rails.

Although not shown in detail, in the section in which none of the travel rails 90 in the pair is discontinued, the transport vehicle V travels on four wheels, with the travel wheels 10 located in the first width direction Y1 and the second width direction Y2 rolling on the upper surfaces of the travel rails 90. The transport vehicle V travels on four wheels in at least the unguided sections SN including no guide rail 80. In the unguided sections SN including no guide rail 80, each guide wheel 13 is located at the first position P1 or the second position P2 without being in contact with any rails.

Figure 6:
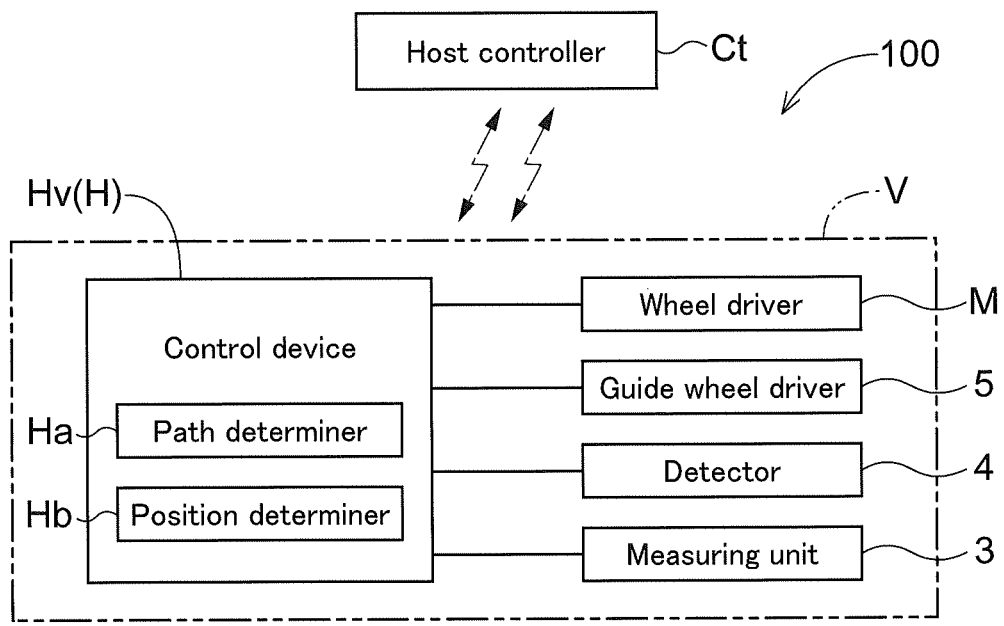
FIG. 6 is a control block diagram.

As shown in FIG. 6, the article transport facility 100 includes a control device Hv installed in each transport vehicle V to control the operation of the transport vehicle V, and a host controller Ct provided separately from the transport vehicle V to entirely or partially manage the facility. In the present embodiment, the control device Hv is a part of or the entire part of the control system H. In some embodiments, the control system H may include the host controller Ct in addition to the control device Hv. The control system H includes, for example, a processor such as a microcomputer, and peripheral circuitry including a memory. The control system H implements the functions with programs executed on a processor such as a computer and the above hardware operating in cooperation.

The host controller Ct transmits, to each transport vehicle V, path information specifying the path along which the transport vehicle V is to travel. The transport vehicle V travels along the travel path R based on the path information transmitted from the host controller Ct. In the example shown in FIG. 1, the path is specified for the transport vehicle V to sequentially travel through the sections G, B, C, D, E, F, and I. In addition to the path information, the host controller Ct transmits, to each transport vehicle V, transportation information specifying the type of the article W to be transported, a sender, and a destination. Each transport vehicle V transports the article W based on the transportation information transmitted from the host controller Ct.

In the present embodiment, the control system H controls a travel of the transport vehicle V by controlling the travel wheel drivers M. The control system H thus accelerates, decelerates, or stops the transport vehicle V. The control system H controls the guide wheel drivers 5 to control the direction of a force to urge the guide wheels 13. More specifically, the control system H controls the guide wheel drivers 5 to urge the guide wheels 13 in the first width direction Y1 or in the second width direction Y2. Each guide wheel 13 urged in the first width direction Y1 without being obstructed by the guide rail 80 is located at the first position P1. Each guide wheel 13 urged in the second width direction Y2 without being obstructed by the guide rail 80 is located at the second position P2.

In the present embodiment, each transport vehicle V includes the detector 4 that detects the detectable members 70 (refer to FIG. 1). In this example, each transport vehicle V includes measuring units 3 that measure the rotational speed of the travel wheels 10. The control system H obtains measurement results from the measuring units 3 and detection results from the detector 4.

In the present embodiment, in addition to the rotational speed of the travel wheels 10, the measuring units 3 measure the travel distance of each transport vehicle V based on the rotational speed. Each measuring unit 3 includes, for example, a rotary encoder. In this example, the measuring units 3 separately measure the rotational speed of the front wheel 10f and the rotational speed of the rear wheel 10r. In other words, the rotary encoder in the measuring unit 3 is provided for each of the front wheel 10f and the rear wheel 10r.

In the present embodiment, the detector 4 reads information from the detectable members 70 on the travel path R. As described above, each detectable member 70 holds address information about its position (information indicating the position on the travel path R). The detector 4 reads the address information held by the detectable members 70 to detect the current position of the transport vehicle V. In the example shown in FIG. 1, the detectable members 70 are located in the unguided sections SN adjacent to and upstream from the guide sections SG in the travel direction X. In this example, the detector 4 reads the address information held by the detectable members 70 to detect the transport vehicle V located in the unguided sections SN.

In the present embodiment, the control system H includes a path determiner Ha that determines the path along which each transport vehicle V is to travel. The path determiner Ha determines the path along which each transport vehicle V is to travel based on the path information transmitted from the host controller Ct. The path information transmitted from the host controller Ct includes the path sequentially connecting the sections G, B, C, D, E, F, and I in the example shown in FIG. 1. The path determiner Ha determines the path along which the transport vehicle V is to travel.

The control system H in the present embodiment determines, based on the path determined by the path determiner Ha, the position of each guide wheel 13 in the width direction Y when the transport vehicle V is to travel through the guide sections SG in the path. In this example, the control system H performs guide wheel shifting control, or controls the guide wheel drivers 5 to shift the guide wheels 13 to the first position P1 or to the second position P2 in accordance with the path for the transport vehicle V in the guide sections SG.

In the example shown in FIG. 1, in the path sequentially connecting the sections G, B, C, D, E, F, and I determined by the path determiner Ha, the sections B, D, and F are guide sections SG. In this case, the control system H determines that the guide wheels 13 in the section B are at the first position P1 in the width direction Y (refer to FIG. 4), the guide wheels 13 in the section D are at the second position P2 in the width direction Y (refer to FIG. 5), and the guide wheels 13 in the section F are at the first position P1 in the width direction Y. The control system H performs guide wheel shifting control based on the determination. Thus, the control system H allows the transport vehicle V to appropriately travel along the path sequentially connecting the sections G, B, C, D, E, F, and I determined by the path determiner Ha.

In the present embodiment, the control system H includes a position determiner Hb that determines that the guide wheels 13 is in a guide section SG. In this example, the position determiner Hb obtains information about the rotational speed of the travel wheels 10 measured by the measuring units 3. The position determiner Hb determines that the guide wheels 13 are in any guide section SG based on a change in a rotational speed difference or a difference in rotational speed between two or more travel wheels 10 spaced from each other in the travel direction X or in the width direction Y by a value greater than or equal to a predefined threshold.

When the transport vehicle V curves on four wheels, the travel wheels 10 inside the curve rotate at a lower speed than the travel wheels 10 outside the curve to cause a rotational speed difference between the travel wheels 10 inside and outside. In the present embodiment, the first front wheel 11*f* and the second front wheel 12*f* rotate at the same speed, and the first rear wheel 11*r* and the second rear wheel 12*r* rotate at the same speed. The transport vehicle V curves on two wheels. The structure in the present embodiment thus causes no rotational speed difference. In some embodiments, when the front wheel 10*f* located inside the curve travels along a curve in the travel rail 90 and the rear wheel 10*r* located in the same width direction Y as the front wheel 10*f* travels along a straight portion in the travel rail 90 downstream from the curve, the front wheel 10*f* rotates at a lower speed than the rear wheel 10*r* to cause a rotational speed difference between the front wheel 10*f* and the rear wheel 10*r*. In contrast, when the front wheel 10*f* located outside the curve travels along a curve in the travel rail 90 and the rear wheel 10*r* located in the same width direction Y as the front wheel 10*f* travels along a straight portion in the travel rail 90 downstream from the curve, the front wheel 10*f* rotates at a higher speed than the rear wheel 10*r* to cause a rotational speed difference between the front wheel 10*f* and the rear wheel 10*r*.

The position determiner Hb determines that the guide wheels 13 are in any guide section SG based on a change in the rotational speed difference between two or more travel wheels 10 caused in the above manner by a value greater than or equal to a predefined threshold.

In the present embodiment, when the transport vehicle V traveling through a straight unguided section SN is to change the moving direction in any curved guide section SG, the position determiner Hb determines that each guide wheel 13 is in the guide section SG based on a change in the rotational speed difference between two or more travel wheels 10 by a value greater than or equal to a threshold. The transport vehicle V to change the moving direction refers to the transport vehicle V moving straight to curve in the first width direction Y1 or in the second width direction Y2. In the example shown in FIG. 1, the transport vehicle V travels through the section G or a straight unguided section SN, and then changes the moving direction in the section B or a guide section SG in the first width direction Y1 (rightward in the figure).

In the present embodiment, the rotational speed difference as a determination criterion for the position determiner Hb is a difference in rotational speed between at least one of the first rear wheel 11*r* or the second rear wheel 12*r* and at least one of the first front wheel 11*f* or the second front wheel 12*f*. More specifically, the position determiner Hb determines that the guide wheels 13 are in any guide section SG based on a change in the rotational speed difference between the front wheel 10*f* and the rear wheel 10*r* by a value greater than or equal to a predefined threshold. The predefined threshold may be predetermined through, for example, experiments reflecting the travel speed of the transport vehicle V or the radius of curvature at the curve in the travel rail 90.

The control system H in the article transport facility 100 according to the present disclosure performs pre-urging for the transport vehicle V sequentially traveling through the first guide section SG1, the unguided section SN, and the second guide section SG2 (refer to FIG. 1) when the guide wheels 13 are at the first position P1 (refer to FIG. 4) in the first guide section SG1 and at the second position P2 (refer to FIG. 5) in the second guide section SG2. The pre-urging is performed to control the guide wheel drivers 5 to urge the guide wheels 13 from the first position P1 toward the second position P2 when the guide wheels 13 in the first guide section SG1 in the first width direction Y1 are in contact with the first side surface 81 of the guide rail 80 before entering the unguided section SN. In the example shown in FIG. 1, the control system H performs pre-urging for the transport vehicle V sequentially traveling through the section B (the first guide section SG1), the section C (the unguided section SN), and the section D (the second guide section SG2) when the guide wheels 13 are at the first position P1 in the section B and at the second position P2 in the section D.

The control system H continuously performing the pre-urging allows the guide wheels 13 to pass through the unguided section SN to move the guide wheels 13 from the first position P1 to the second position P2 in the unguided section SN, and places the guide wheels 13 in the second width direction Y2 in the second guide section SG2 into contact with the second side surface 82 of the guide rail 80. In the example shown in FIG. 1, the control system H continuously performing the pre-urging allows the guide wheels 13 to pass through the section C (the unguided section SN) to move the guide wheels 13 from the first position P1 to the second position P2, and places the guide wheels 13 in the second width direction Y2 in the section D (the second guide section SG2) into contact with the second side surface 82 of the guide rail 80.

With reference to FIGS. 7 to 11, the procedure of pre-urging will be described below in time series for the transport vehicle V sequentially traveling through the first guide section SG1, the unguided section SN, and the second guide section SG2. In FIGS. 7 to 11, outlined arrows on the guide wheels 13 indicate the direction in which the guide wheels 13 are urged, rather than indicating displacement of the guide wheels 13.

Figure 7:
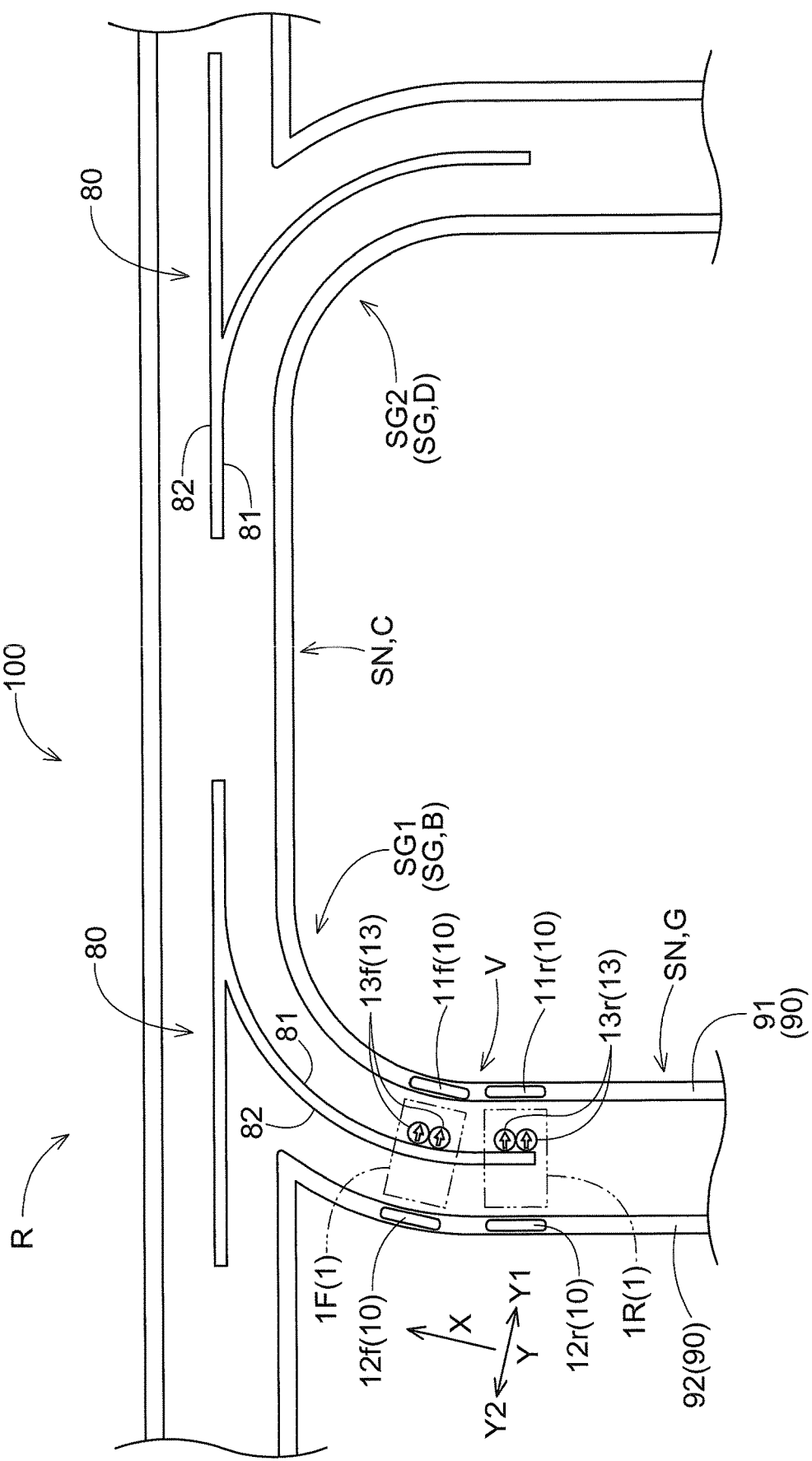
FIG. 7 is a diagram describing shifting of guide wheels through pre-urging.

As shown in FIG. 7, the control system H controlling the guide wheel drivers 5 to move the guide wheels 13 to the first position P1 allows the guide wheels 13 to enter the first guide section SG1. Thus, the guide wheels 13 are urged in the first width direction Y1 to roll on the first side surface 81 of the guide rail 80. When the transport vehicle V approaches a curve, the first rear wheel 11*r* rolls on a straight portion in the travel rail 90, and the first front wheel 11*f* rolls on a curve (inside the curve) in the travel rail 90. Thus, the first rear wheel 11*r* rolls on a longer distance than the first front wheel 11*f*, and a rotational speed difference occurs between the first rear wheel 11*r* and the first front wheel 11*f*. The position determiner Hb determines an approach of the transport vehicle V to the curve, or more specifically, determines that the guide wheels 13 are in the curved first guide section SG1 based on a change in the rotational speed difference by a value greater than or equal to a predefined threshold.

Figure 8:
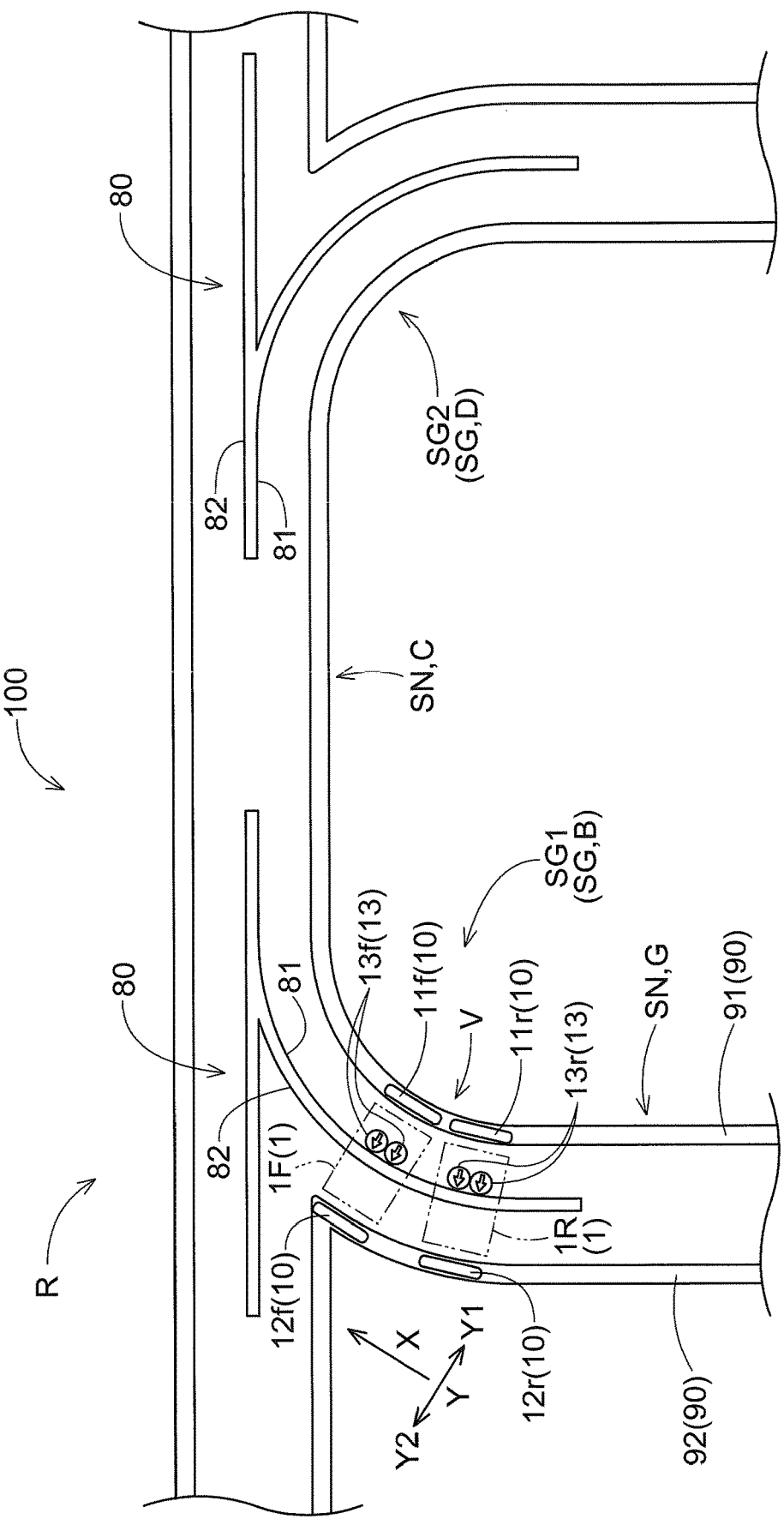
FIG. 8 is a diagram describing shifting of the guide wheels through pre-urging.

As shown in FIG. 8, the control system H performs pre-urging when the guide wheels 13 in the first width direction Y1 in the first guide section SG1 are in contact with the first side surface 81 of the guide rail 80 before entering the unguided section SN. The control system H performs the pre-urging to urge the guide wheels 13 from the first position P1 toward the second position P2. In other words, the control system H urges the guide wheels 13 in the second width direction Y2. In the present embodiment, the control system H performs pre-urging within a period from when the position determiner Hb determines that the guide wheels 13 are in the first guide section SG1 to when the transport vehicle V travels a distance set based on the length of the first guide section SG1 in the travel direction X. The set distance is shorter than the length of the first guide section SG1 in the travel direction X. More specifically, the set distance is shorter than the length of the guide rail 80 from a start (the position of the front guide wheels 13f in FIG. 7) of a curve to a downstream end in the travel direction X. Thus, the control system H can reliably perform pre-urging before the guide wheels 13 enter the unguided section SN.

In the present embodiment, the control system H simultaneously performs pre-urging on both the front guide wheels 13f and the rear guide wheels 13r after the rear guide wheels 13r enter the first guide section SG1 and before the front guide wheels 13f enter the unguided section SN. In this example, the position determiner Hb determines that the rear guide wheels 13r are in the first guide section SG1 based on the travel distance of the transport vehicle V from when the front guide wheels 13f are determined to be in the first guide section SG1. More specifically, the distance between the front guide wheels 13f and the rear guide wheels 13r in the travel direction X is known. Thus, the position determiner Hb can determine that the rear guide wheels 13r are in the first guide section SG1 based on the travel distance of the transport vehicle V from when the front guide wheels 13f are determined to be in the first guide section SG1. Thus, the control system H can simultaneously perform pre-urging on both the front guide wheels 13f and the rear guide wheels 13r after reliably determining that the front guide wheels 13f and the rear guide wheels 13r are in the first guide section SG1.

Pre-urging simultaneously performed on both the front guide wheels 13f and the rear guide wheels 13r simultaneously urges the front guide wheels 13f and the rear guide wheels 13r in the second width direction Y2. The front guide wheels 13f and the rear guide wheels 13r in the first width direction Y1 are in contact with the first side surface 81 of the guide rail 80, without being displaced in the width direction Y although being urged in the second width direction Y2. More specifically, the guide wheels 13 are pressed against the first side surface 81 with the force corresponding to the weight of the transport vehicle V. The urging force is applied on the guide wheels 13 during pre-urging to maintain the guide wheels 13 at the first position P1 (in other words, not to displace the guide wheels 13 in the width direction Y).

Figure 9:
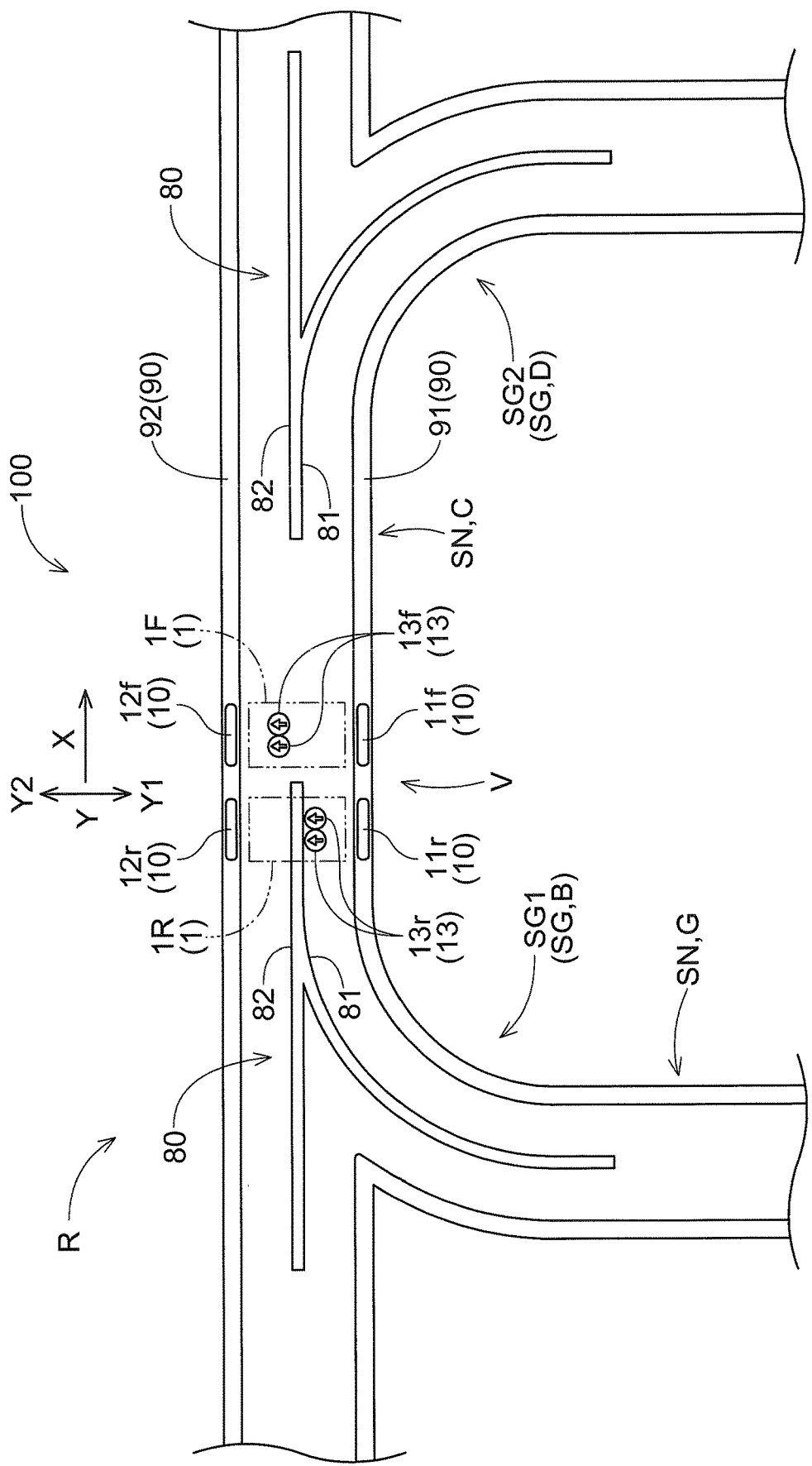
FIG. 9 is a diagram describing shifting of the guide wheels through pre-urging.
Figure 10:
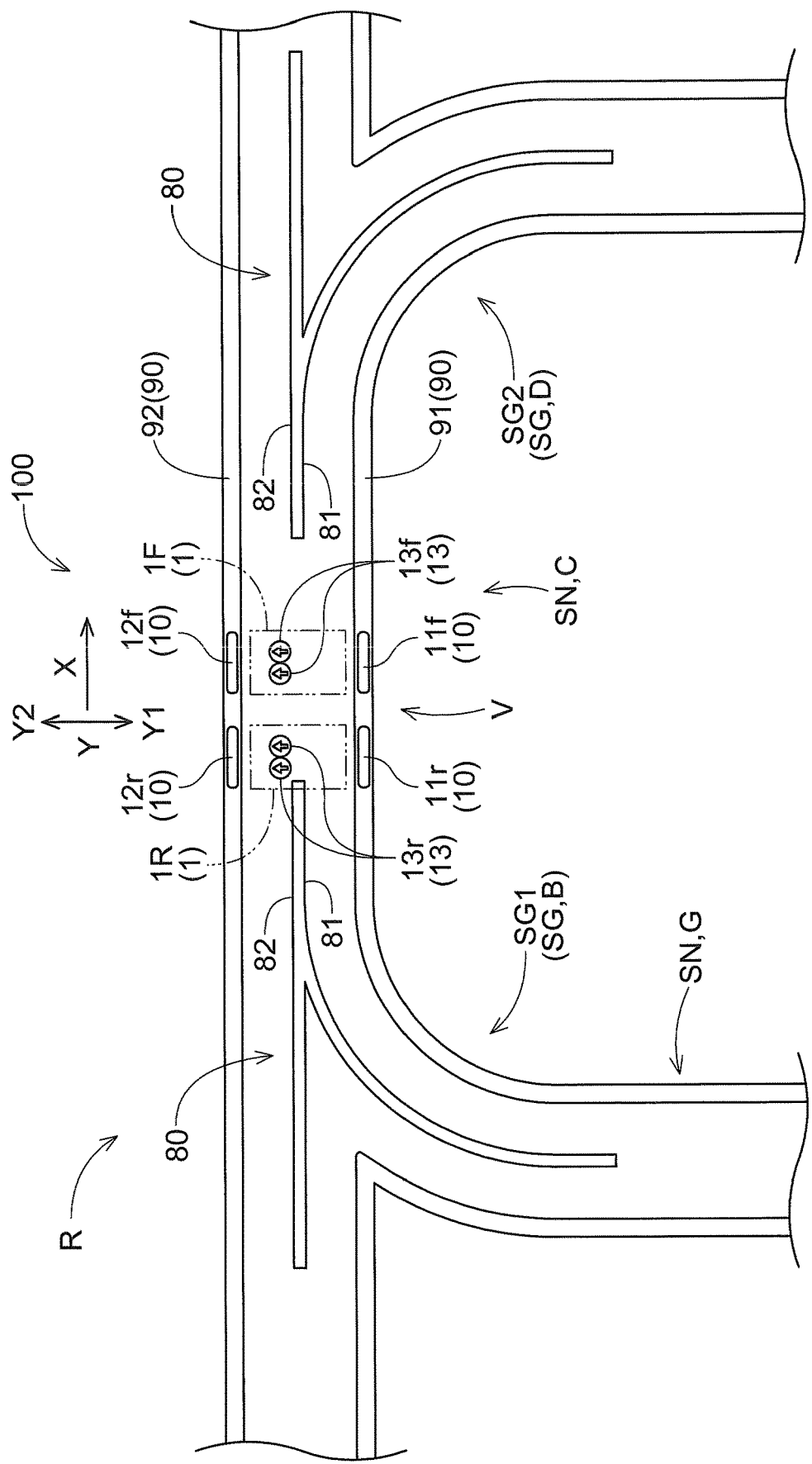
FIG. 10 is a diagram describing shifting of the guide wheels through pre-urging.

As shown in FIGS. 9 and 10, the control system H continuously performs the pre-urging to move the guide wheels 13 from the first position P1 to the second position P2 in the unguided section SN, thus allowing the guide wheels 13 to pass through the unguided section SN.

In the present embodiment, the transport vehicle V includes the front guide wheels 13f and the rear guide wheels 13r spaced from each other in the travel direction X. Thus, as shown in FIG. 9, the front guide wheels 13f alone move from the first position P1 to the second position P2 and enter the unguided section SN although no rear guide wheels 13r enter the unguided section SN. As shown in FIG. 10, the rear guide wheels 13r enter the unguided section SN following the front guide wheels 13f and move from the first position P1 to the second position P2. More specifically, in the present embodiment, when entering the unguided section SN, the front guide wheels 13f and the rear guide wheels 13r are sequentially positionally shifted in the width direction Y. Although the unguided section SN is short or the transport vehicle V travels at a high speed, both the front guide wheels 13f and the rear guide wheels 13r can be appropriately and fully shifted positionally in the width direction Y within the unguided section SN.

Figure 11:
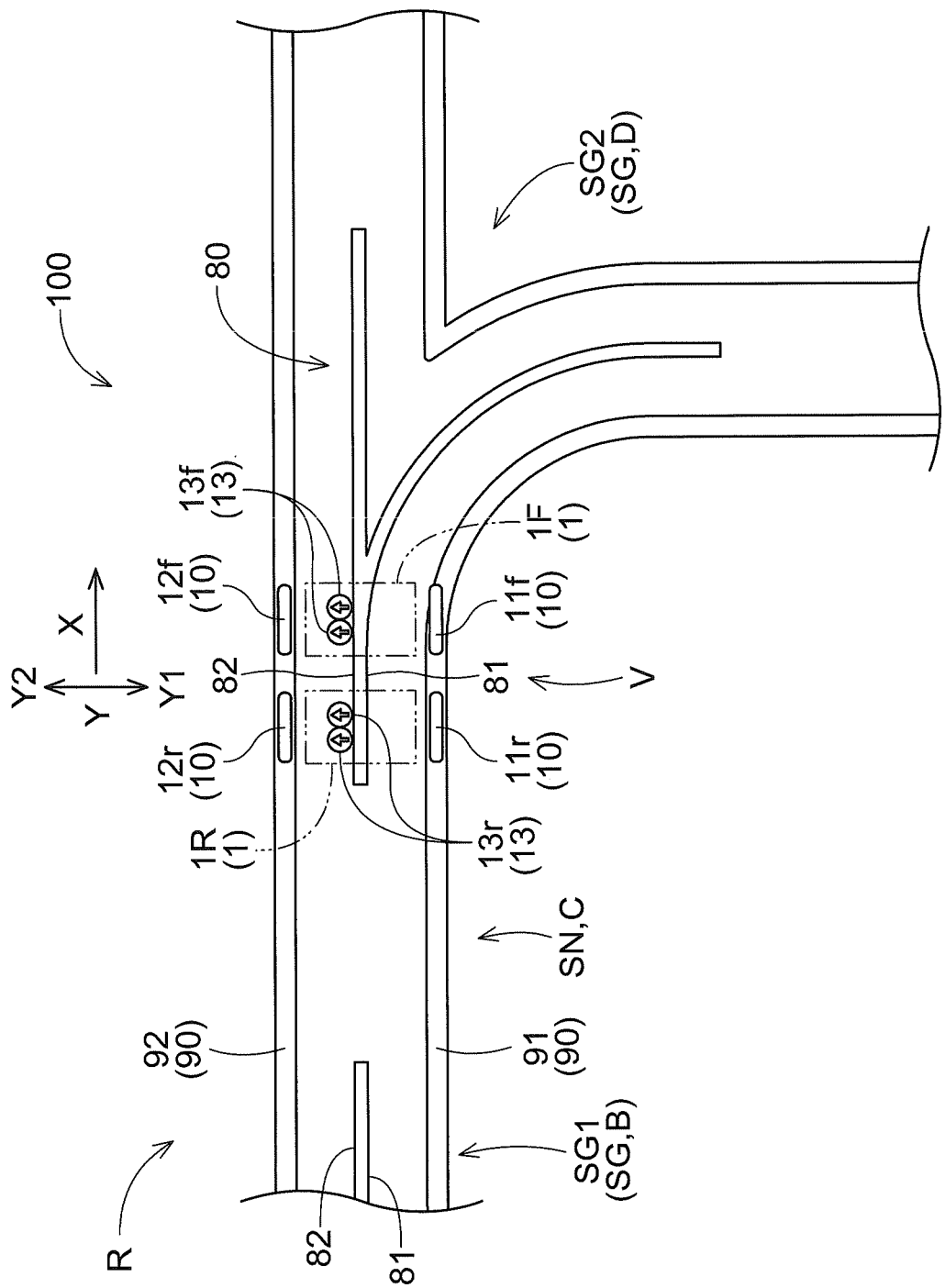
FIG. 11 is a diagram describing shifting of the guide wheels through pre-urging.

As shown in FIG. 11, after moving the guide wheels 13 from the first position P1 to the second position P2 in the unguided section SN, the control system H maintains the guide wheels 13 in the second width direction Y2 in the second guide section SG2 at the position and then places the guide wheels 13 into contact with the second side surface 82 of the guide rail 80. Thus, the transport vehicle V travels from the section D to the section E (refer to FIG. 1).

In the present embodiment, the control system H does not perform pre-urging for the transport vehicle V sequentially traveling through the first guide section SG1, the unguided section SN, and the second guide section SG2 when the unguided section SN has a length greater than or equal to a predetermined threshold in the travel direction X. More specifically, although the guide wheels 13 are to be positionally shifted in the width direction Y from the first position P1 to the second position P2 with the transport vehicle V sequentially traveling through the first guide section SG1, the unguided section SN, and the second guide section SG2, the transport vehicle V traveling through the unguided section SN that is sufficiently long can positionally shift the guide wheels 13 in the width direction Y. In this case, the control system H controls the guide wheel drivers 5 to urge and move the guide wheels 13 from the first position P1 to the second position P2 after the guide wheels 13 exit from the first guide section SG1 and enter the unguided section SN. Pre-urging may cause vibrations due to a sudden positional change in the guide wheels 13 at the exit from the first guide section SG1. However, the unguided section SN that is sufficiently long eliminates pre-urging to avoid such vibrations. The above predetermined threshold compared with the length of the unguided section SN in the travel direction X may be determined through, for example, experiments based on the travel speed of the transport vehicle V, for example, the average speed or the maximum speed of the transport vehicle V traveling along the travel path R.

In the present embodiment, the control system H does not perform pre-urging for the transport vehicle V sequentially traveling through the first guide section SG1, the unguided section SN, and the second guide section SG2 when the guide wheels 13 are at the same position in the width direction Y in the first guide section SG1 and in the second guide section SG2. For example, as shown in FIG. 1, when the transport vehicle V sequentially travels through the sections A, B, C, and D, of which the section B is the first guide section SG1 and the section D is the second guide section SG2, the guide wheels 13 are not positionally shifted in the width direction Y when the transport vehicle V sequentially travels through the first guide section SG1, the unguided section SN, and the second guide section SG2. More specifically, the guide wheels 13 in the section B (the first guide section SG1) are determined to be at the second position P2, and the guide wheels 13 in the section D (the second guide section SG2) are also determined to be at the second position P2. Thus, the guide wheels 13 are not to be positionally shifted in the width direction Y, and the control system H does not perform pre-urging.

Figure 12:
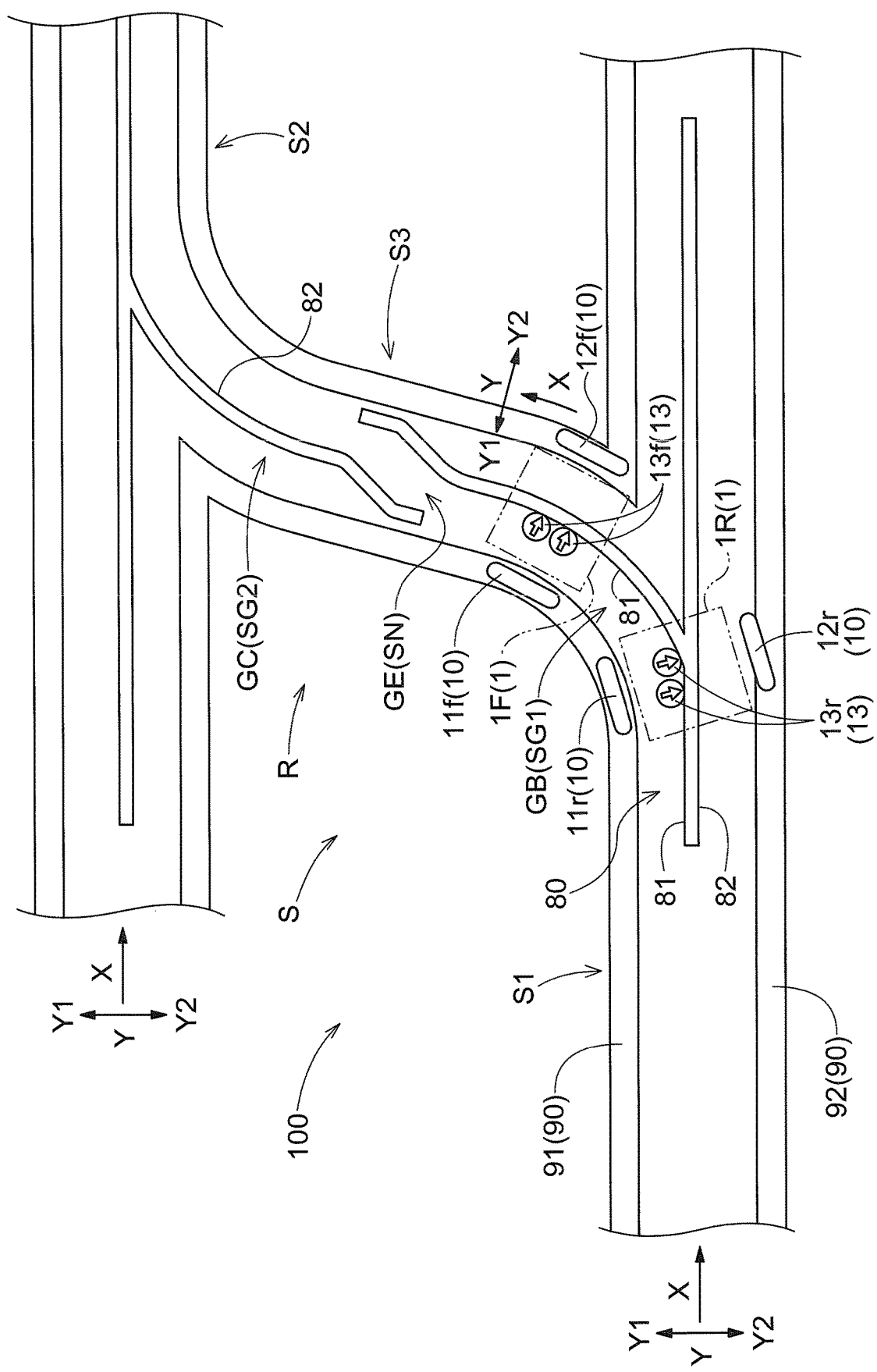
FIG. 12 is a diagram describing shifting of the guide wheels in a junction section.
Figure 13:
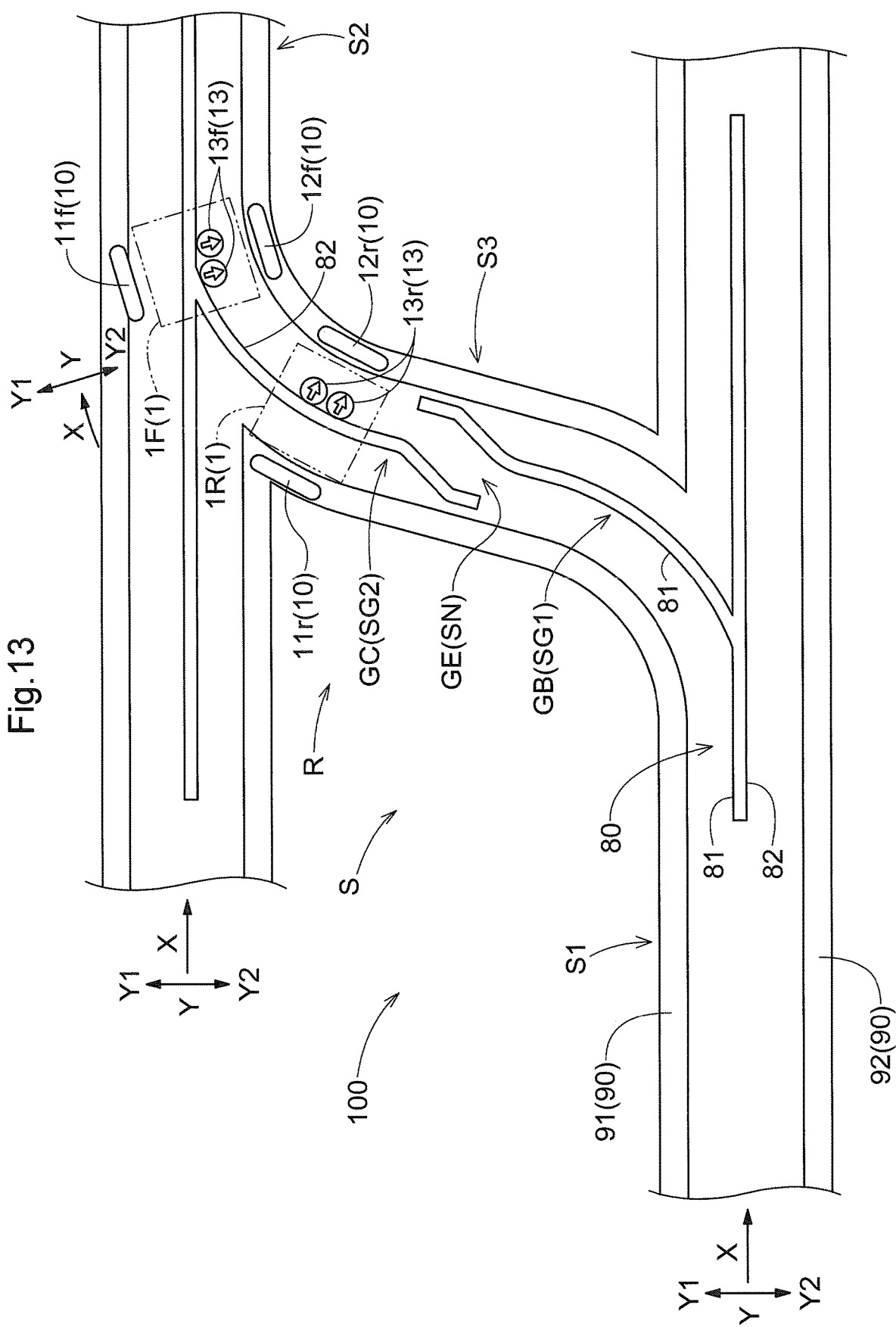
FIG. 13 is a diagram describing shifting of the guide wheels in the junction section.

As shown in FIGS. 12 and 13, the travel path R in the present embodiment includes a junction section S at which portions in the travel path R diverge and merge. The junction section S is an example of a section on the travel path R including an intersection. To allow the transport vehicle V to travel through the junction section S, the guide wheels 13 are to be promptly positionally shifted in the width direction Y. The control system H performs pre-urging in this case as well. The details will be described below. In contrast to the above, FIGS. 12 and 13 show an example in which the first width direction Y1 is leftward with reference to the moving direction, and the second width direction Y2 is rightward with reference to the moving direction.

As shown in FIGS. 12 and 13, the junction section S includes a first section S1, a second section S2 parallel to the first section S1, and a connection section S3 connecting the first section 51 and the second section S2.

The connection section S3 diverges from the first section S1 in the first width direction Y1, and merges with the second section S2 in the second width direction Y2. The transport vehicle V traveling through the junction section S travels from the first section S1 diverging in the first width direction Y1 through the connection section S3 to the second section S2 merging at a position in the second width direction Y2.

The guide rails 80 include a divergence guide GB extending from the first section S1 to a point in the connection section S3, a merge guide GC extending from a point in the connection section S3 to the second section S2, and a shift area GE located between the divergence guide GB and the merge guide GC in the travel direction X to allow the guide wheels 13 to move in the width direction Y. The section including the divergence guide GB is the first guide section SG1. The section including the shift area GE is the unguided section SN. The section including the merge guide GC is the second guide section SG2.

As shown in FIG. 12, the control system H controls the guide wheel drivers 5 to urge the guide wheels 13 from the first position P1 toward the second position P2 when the guide wheels 13 in the first width direction Y1 in the section including the divergence guide GB (the first guide section SG1) are in contact with the first side surface 81 of the divergence guide GB (the guide rail 80) before entering the shift area GE (the unguided section SN). More specifically, the control system H urges the guide wheels 13 in the second width direction Y2.

As shown in FIG. 13, the control system H continuously performing the pre-urging allows the guide wheels 13 to pass through the shift area GE (the unguided section SN) to move the guide wheels 13 from the first position P1 to the second position P2 in the shift area GE, and places the guide wheels 13 in the second width direction Y2 in the merge guide GC (the second guide section SG2) into contact with the second side surface 82 of the merge guide GC (the guide rail 80).

The control system H performs pre-urging when the transport vehicle V travels through the junction section S. The transport vehicle V can thus smoothly travel through the junction section S.

The article transport facility 100 described above can positionally shift the guide wheels 13 in the width direction Y appropriately without decelerating the transport vehicle V.

OTHER EMBODIMENTS

An article transport facility according to other embodiments will be described below.

Figure 14:
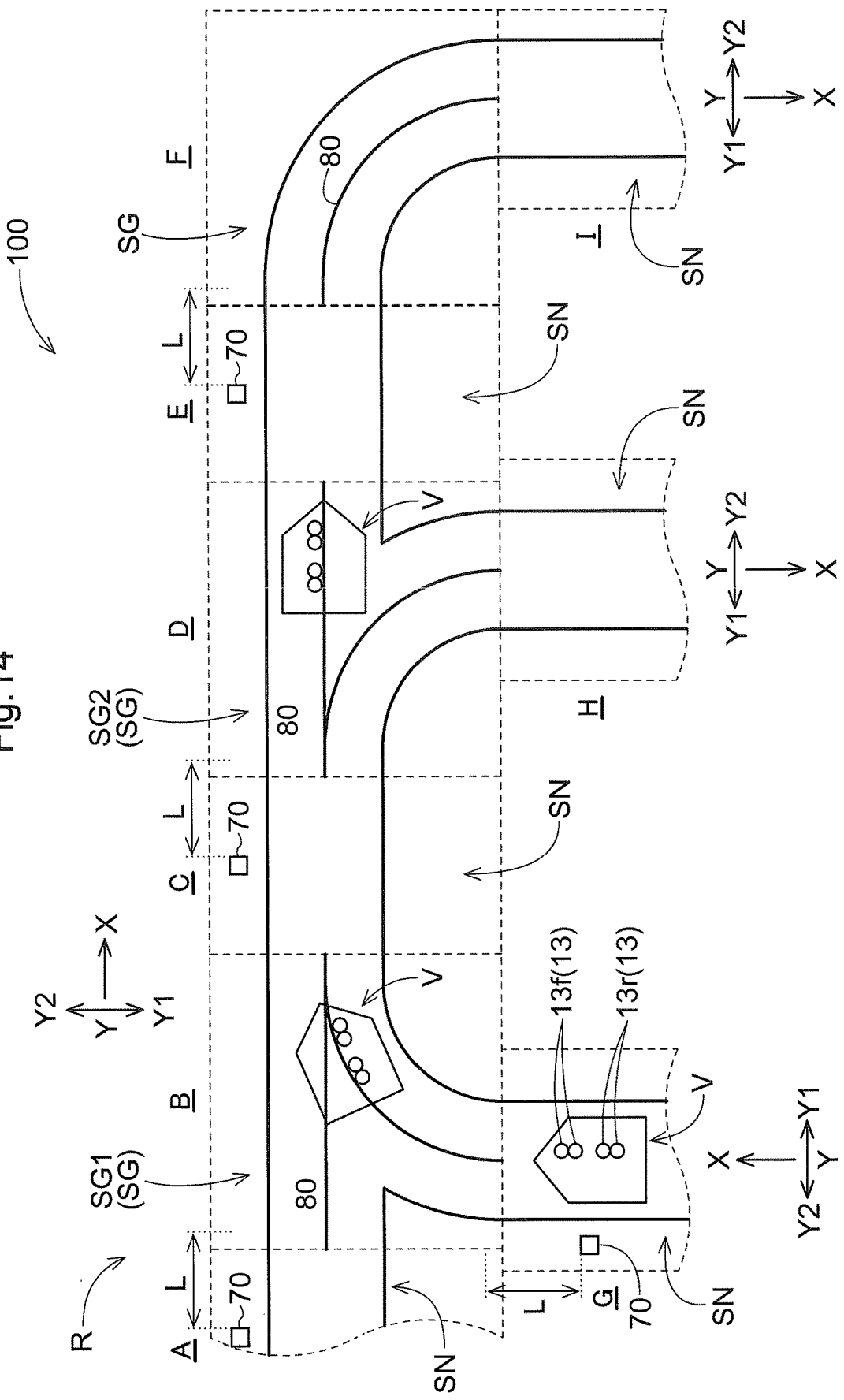
FIG. 14 is a partial plan view of an article transport facility according to another embodiment.

(1) In the above embodiment, the position determiner Hb determines that the guide wheels 13 are in any guide section SG based on a change in the rotational speed difference or a difference in rotational speed between two or more travel wheels 10 spaced from each other in the travel direction X or the width direction Y by a value greater than or equal to a predefined threshold. In some embodiments, the position determiner Hb may determine that the guide wheels 13 are in any guide section SG with another method. For example, as shown in FIG. 14, the position determiner Hb may determine that the guide wheels 13 are in any guide section SG based on a travel of the transport vehicle V by a predetermined distance L from when the detector 4 (refer to FIG. 6) has detected the detectable member 70. As described above, the detectable members 70 are located in the unguided sections SN adjacent to and upstream from the guide sections SG in the travel direction X. The distance from each detectable member 70 to the guide section SG adjacent to the detectable member 70 is known. In the example shown in FIG. 14, the distance L is longer than the distance from the detectable member 70 to the guide section SG adjacent to the detectable member 70 by a predefined excess distance. This excess distance is set based on the distance in the travel direction X between the detector 4 and the guide wheels 13 in the transport vehicle V. This is because the distance from when the detector 4 detects each detectable member 70 to when the detector 4 enters the corresponding guide section SG differs from the distance from when the detector 4 detects the detectable member 70 to when the guide wheels 13 enter the guide section SG depending on the positions of the detector 4 and the guide wheels 13. For example, when the detector 4 and the guide wheels 13 are located at the same position in the travel direction X, the excess distance is zero, and the distance L is substantially equal to the distance from the detectable member 70 to the guide section SG adjacent to the detectable member 70. This structure can reliably determine that the guide wheels 13 are in the guide section SG when the transport vehicle V has traveled a predetermined distance L from when the detector 4 detects the detectable member 70. The determination as to whether the transport vehicle V has traveled the predetermined distance L is performed based on the measurement results from the measuring unit 3 (refer to FIG. 6) that can measure the travel distance of the transport vehicle V.

(2) In the above embodiment, the control system H does not perform pre-urging for the transport vehicle V sequentially traveling through the first guide section SG1, the unguided section SN, and the second guide section SG2 when the unguided section SN has a length greater than or equal to the predetermined threshold in the travel direction X. In some embodiments, the control system H may perform pre-urging although the unguided section SN has a length greater than or equal to the predetermined threshold in the travel direction X.

(3) In the above embodiment, the control system H simultaneously performs pre-urging on both the front guide wheels 13f and the rear guide wheels 13r after the rear guide wheels 13r enter the first guide section SG1 and before the front guide wheels 13f enter the unguided section SN. In some embodiments, the control system H may perform pre-urging sequentially on the front guide wheels 13f and the rear guide wheels 13r. That is the control system H may perform pre-urging on the front guide wheels 13f after the front guide wheels 13f enter the first guide section SG1 and before the front guide wheels 13f enter the unguided section SN. and the control system H may sequentially perform pre-urging on the rear guide wheels 13r after the rear guide wheels 13r enter the first guide section SG1 and before the rear guide wheels 13r enter the unguided section SN.

(4) In the above embodiment, the front guide wheels 13f and the rear guide wheels 13r are driven independently of each other. In some embodiments, the front guide wheels 13f and the rear guide wheels 13r may be driven integrally.

(5) In the above embodiment, the transport vehicle V includes the front guide wheels 13f as the guide wheels 13 included in the front traveler 1F, and the rear guide wheels 13r as the guide wheels 13 included in the rear traveler 1R.

In some embodiments, the transport vehicle V may include a single traveler 1 and a single guide wheel 13.

(6) In the above embodiment, the transport vehicle V includes the detector 4 that detects the detectable members 70 (refer to FIG. 1). In some embodiments, the transport vehicle V may eliminate the detector 4.

(7) The structure described in each of the above embodiments may be combined with any other structures described in the other embodiments unless any contradiction arises. The embodiments described herein are merely illustrative in all respects and may be modified variously as appropriate without departing from the spirit and scope of the present disclosure.

Overview of Embodiment

Hereafter, the article transport facility will be described.

An article transport facility includes a pair of travel rails along a travel path, a transport vehicle that travels along the travel path to transport an article, a guide rail located in at least one of a section on the travel path including an intersection or a section on the travel path including a curve to guide the transport vehicle, and a control system that controls the transport vehicle. The transport vehicle includes travel wheels that roll on upper surfaces of the pair of travel rails, a guide wheel that rolls on a first side surface of the guide rail facing in a first width direction or on a second side surface of the guide rail facing in a second width direction, and a guide wheel driver that moves the guide wheel in the width direction to a first position for the guide wheel to roll on the first side surface and to a second position for the guide wheel to roll on the second side surface. The first width direction and the second width direction opposite to the first width direction are included in a width direction perpendicular to a travel direction along the travel path when viewed from above or below. The travel path includes a plurality of guide sections each including the guide rail and an unguided section including no guide rail. The plurality of guide sections include a first guide section and a second guide section, and the second guide section is located downstream from the first guide section in the travel direction across the unguided section. The control system performs pre-urging for the transport vehicle sequentially traveling through the first guide section, the unguided section, and the second guide section when the guide wheel is at the first position in the first guide section and at the second position in the second guide section. The pre-urging is performed to control the guide wheel driver to urge the guide wheel from the first position toward the second position when the guide wheel in the first width direction in the first guide section is in contact with the first side surface of the guide rail before entering the unguided section. The control system continuously performing the pre-urging allows the guide wheel to pass through the unguided section to move the guide wheel from the first position to the second position in the unguided section, and places the guide wheel in the second width direction in the second guide section into contact with the second side surface of the guide rail.

The above structure performs pre-urging to urge the guide wheel toward the second position after the guide wheel enters the first guide section and before the guide wheel enters the unguided section. When entering the unguided section, the guide wheel can be promptly shifted in the width direction from the first position to the second position. Thus, the guide wheel can be promptly shifted in the unguided section. This structure reduces the chances to decelerate the transport vehicle for shifting the guide wheel. This structure can thus positionally shift the guide wheel in the width direction appropriately with less deceleration of the transport vehicle. With less deceleration of the transport vehicle, the transportation efficiency of the overall facility is less likely to decrease.

The control system may avoid performing the pre-urging for the transport vehicle sequentially traveling through the first guide section, the unguided section, and the second guide section when the guide wheel is at the same position in the width direction in the first guide section and in the second guide section.

The control system with the above structure may avoid performing pre-urging when the guide wheel involves no positional shifting in the width direction. The control system thus appropriately allows the transport vehicle to travel without unintendedly operating the guide wheel drivers.

The control system may avoid performing the pre-urging for the transport vehicle sequentially traveling through the first guide section, the unguided section, and the second guide section when the unguided section has a length greater than or equal to a predetermined threshold in the travel direction.

The pre-urging may cause vibrations due to a sudden positional change in the guide wheel at the exit from the first guide section. When the unguided section SN is sufficiently long, the control system with the above structure to positionally shift the guide wheel in the width direction positionally shifts the guide wheel in the width direction after the guide wheel enters the unguided section without performing pre-urging. Thus, the control system easily avoids the vibrations.

The travel wheels may be spaced from each other in at least the travel direction or the width direction. The control system may include a position determiner that determines that the guide wheel is in one of the plurality of guide sections. The position determiner may determine that the guide wheel is in one of the plurality of guide sections based on a change in a rotational speed difference by a value greater than or equal to a predefined threshold. The rotational speed difference may be a difference in rotational speed between two or more of the travel wheels spaced from each other in the travel direction or in the width direction.

The guide section corresponds to at least one of the section including an intersection or the section including a curve, and thus the travel rail basically curves along the travel path. When the transport vehicle enters the guide section from the section on the travel path including a straight portion to travel along a curve, two or more travel wheels have a rotational speed difference. This phenomenon allows the above structure to determine that the transport vehicle is traveling along a curve in the travel rail, or that the guide wheel is in the guide section. Thus, the structure can eliminate, for example, a dedicated sensor for detecting the guide wheel in the guide section.

The travel wheels may include a first front wheel that rolls on an upper surface of a first travel rail being a travel rail in the pair located in the first width direction, a first rear wheel that rolls on the first travel rail and is located at a rear of the first front wheel in the moving direction, a second front wheel that rolls on an upper surface of a second travel rail being a travel rail in the pair located in the second width direction, and a second rear wheel that rolls on the second travel rail and is located at a rear of the second front wheel in the moving direction. The rotational speed difference may be a difference in rotational speed between at least one of the first rear wheel or the second rear wheel and at least one of the first front wheel or the second front wheel.

When the transport vehicle travels through a guide section including a curve, the wheel rolling on the travel rail of the pair radially inside the arc in the guide section decelerates further than when rolling on the travel rail in the straight section. The wheel rolling on the travel rail of the pair radially outside the arc in the guide section accelerates further than when rolling on the travel rail in the straight section. When a pair of front wheels in the transport vehicle enter the guide section from a straight section to roll on the curved travel rails, one of the front wheels decelerates further, and the other front wheel accelerates further than the rear wheels at that time. This phenomenon allows the above structure to determine that the guide wheels are in the guide section.

The control system may perform the pre-urging within a period from when the position determiner determines that the guide wheel is in the first guide section to when the transport vehicle travels a distance set based on a length of the first guide section in the travel direction.

The above structure can appropriately perform pre-urging with the guide wheel in the first guide section based on the travel distance of the transport vehicle.

The transport vehicle may include a detector that detects a detectable member at a predetermined position on the travel path. The control system may include a position determiner that determines that the guide wheel is in one of the plurality of guide sections. The position determiner may determine that the guide wheel is in one of the plurality of guide sections based on a travel of the transport vehicle by a predetermined distance from when the detector detects the detectable member.

The above structure can appropriately determine that the guide wheel is in the guide section based on the detection results from the detector detecting a target and the travel distance of the transport vehicle.

The transport vehicle may include a front traveler including a front wheel as one of the travel wheels, a rear traveler including a rear wheel as one the travel wheels, a front guide wheel placed on the front traveler as the guide wheel, and a rear guide wheel placed on the rear traveler as the guide wheel. The control system may simultaneously perform the pre-urging on the front guide wheel and the rear guide wheel after the rear guide wheel enters the first guide section and before the front guide wheel enters the unguided section.

The above structure can perform pre-urging on both the front guide wheel and the rear guide wheel in response to a single command under simple control. The structure sequentially and positionally shifts the guide wheels in the width direction when the front and rear guide wheels enter the unguided section. Although the unguided section is short or the transport vehicle travels at a high speed, both the front and rear guide wheels can be appropriately and fully shifted positionally in the width direction within the unguided section.

The travel path may include a junction section at which the travel path diverges and merges. The junction section may include a first section, a second section parallel to the first section, and a connection section connecting the first section and the second section. The connection section may diverge from the first section in the first width direction and may merge with the second section at a position in the second width direction. The guide rail may include a divergence guide extending from the first section to a point in the connection section, a merge guide extending from a point in the connection section to the second section, and a shift area located between the divergence guide and the merge guide in the travel direction to allow the guide wheel to move in the width direction. The first guide section may include the divergence guide. The unguided section may include the shift area. The second guide section may include the merge guide.

The above structure can positionally shift the guide wheel in the width direction appropriately although the transport vehicle travels through the junction section at which the travel path diverges and merges.

INDUSTRIAL APPLICABILITY

The technique according to the embodiments of the present disclosure is applicable to an article transport facility including a pair of travel rails along a travel path, a transport vehicle that travels along the travel path to transport an article, and a guide rail that guides the transport vehicle.

What is claimed is:
1. An article transport facility, comprising:
a pair of travel rails along a travel path;
a transport vehicle configured to travel along the travel path to transport an article;
a guide rail located in at least one of a section on the travel path including an intersection or a section on the travel path including a curve to guide the transport vehicle; and
a control system configured to control the transport vehicle,
wherein the transport vehicle comprises:
travel wheels configured to roll on upper surfaces of the pair of travel rails,
a guide wheel configured to roll on a first side surface of the guide rail facing in a first width direction or on a second side surface of the guide rail facing in a second width direction, the first width direction and the second width direction opposite to the first width direction are included in a width direction perpendicular to a travel direction along the travel path when viewed from above or below, and
a guide wheel driver configured to move the guide wheel in the width direction to a first position for the guide wheel to roll on the first side surface and to a second position for the guide wheel to roll on the second side surface,
wherein:
the travel path includes a plurality of guide sections each including the guide rail and an unguided section including no guide rail,
the plurality of guide sections include a first guide section and a second guide section, and the second guide section is located downstream from the first guide section in the travel direction across the unguided section,
the control system performs pre-urging for the transport vehicle sequentially traveling through the first guide section, the unguided section, and the second guide section when the guide wheel is at the first position in the first guide section and at the second position in the second guide section,
the pre-urging is performed to control the guide wheel driver to urge the guide wheel from the first position toward the second position when the guide wheel in the first width direction in the first guide section is in contact with the first side surface of the guide rail before entering the unguided section, and
the control system continuously performing the pre-urging allows the guide wheel to pass through the unguided section to move the guide wheel from the first position to the second position in the unguided section, and places the guide wheel in the second width direction in the second guide section into contact with the second side surface of the guide rail.

2. The article transport facility according to claim 1, wherein the control system avoids performing the pre-urging for the transport vehicle sequentially traveling through the first guide section, the unguided section, and the second guide section when the guide wheel is at the same position in the width direction in the first guide section and in the second guide section.

3. The article transport facility according to claim 1, wherein the control system avoids performing the pre-urging for the transport vehicle sequentially traveling through the first guide section, the unguided section, and the second guide section when the unguided section has a length greater than or equal to a predetermined threshold in the travel direction.

4. The article transport facility according to claim 1, wherein:
the travel wheels are spaced from each other in at least the travel direction or the width direction,
the control system comprises a position determiner configured to determine that the guide wheel is in one of the plurality of guide sections, and
the position determiner determines that the guide wheel is in one of the plurality of guide sections based on a change in a rotational speed difference by a value greater than or equal to a predefined threshold, and the rotational speed difference is a difference in rotational speed between two or more of the travel wheels spaced from each other in the travel direction or in the width direction.

5. The article transport facility according to claim 4, wherein the travel wheels comprise a first front wheel configured to roll on an upper surface of a first travel rail is a travel rail in the pair located in the first width direction, a first rear wheel configured to roll on the first travel rail and located at a rear of the first front wheel in the moving direction, a second front wheel configured to roll on an upper surface of a second travel rail is a travel rail in the pair located in the second width direction, and a second rear wheel configured to roll on the second travel rail and located at a rear of the second front wheel in the moving direction, and
wherein the rotational speed difference is a difference in rotational speed between at least one of the first rear wheel or the second rear wheel and at least one of the first front wheel or the second front wheel.

6. The article transport facility according to claim 4, wherein the control system performs the pre-urging within a period from when the position determiner determines that the guide wheel is in the first guide section to when the transport vehicle travels a distance set based on a length of the first guide section in the travel direction.

7. The article transport facility according to claim 1, wherein:
the transport vehicle comprises a detector configured to detect a detectable member at a predetermined position on the travel path,
the control system comprises a position determiner configured to determine that the guide wheel is one of the plurality of guide sections, and
the position determiner determines that the guide wheel is in one of the plurality of guide sections based on a travel of the transport vehicle by a predetermined distance from when the detector detects the detectable member.

8. The article transport facility according to claim 1, wherein the transport vehicle comprises:
a front traveler comprising a front wheel as one of the travel wheels,
a rear traveler comprising a rear wheel as one the travel wheels,
a front guide wheel placed on the front traveler as the guide wheel, and
a rear guide wheel placed on the rear traveler as the guide wheel, and
wherein the control system simultaneously performs the pre-urging on the front guide wheel and the rear guide wheel after the rear guide wheel enters the first guide section and before the front guide wheel enters the unguided section.

9. The article transport facility according to claim 1, wherein:
the travel path includes a junction section at which the travel path diverges and merges,
the junction section comprises:
a first section,
a second section parallel to the first section, and
a connection section connecting the first section and the second section,
the connection section diverges from the first section in the first width direction and merges with the second section at a position in the second width direction,
the guide rail comprises:
a divergence guide extending from the first section to a point in the connection section,
a merge guide extending from a point in the connection section to the second section, and
a shift area located between the divergence guide and the merge guide in the travel direction to allow the guide wheel to move in the width direction,
the first guide section includes the divergence guide,
the unguided section includes the shift area, and
the second guide section includes the merge guide.

* * * * *